(12) United States Patent
Smith

(10) Patent No.: US 6,724,897 B1
(45) Date of Patent: Apr. 20, 2004

(54) AMPLIFIER WITH ALTERNATE OUTPUT LEVEL

(76) Inventor: Randall C. Smith, 1317 Ross St., Petaluma, CA (US) 94954

( * ) Notice: Subject to any disclaimer, the term of this patent is extended or adjusted under 35 U.S.C. 154(b) by 376 days.

(21) Appl. No.: 09/632,205

(22) Filed: Aug. 2, 2000

(51) Int. Cl.[7] .............................. H03G 3/00; H03G 3/10; H03G 3/20; H03F 21/00
(52) U.S. Cl. ........................ 381/61; 330/284; 330/144; 381/120; 381/104; 381/109
(58) Field of Search .................................. 381/120, 118, 381/104–109, 94.5, 61; 330/207 A, 251, 144, 284

(56) References Cited

U.S. PATENT DOCUMENTS

| | | | | |
|---|---|---|---|---|
| 6,140,870 A | * | 10/2000 | Cook | 330/3 |
| 6,522,752 B1 | * | 2/2003 | Smith | 381/61 |
| 6,621,907 B1 | * | 9/2003 | Smith | 381/94.5 |

* cited by examiner

Primary Examiner—Minsun Oh Harvey
Assistant Examiner—Laura A. Grier
(74) Attorney, Agent, or Firm—Jay M. Cantor

(57) ABSTRACT

A guitar amplifier having an input terminal, an audio output and an audio level controller connected between the input terminal and the audio output. The audio level controller includes a first attenuation path, a second attenuation path having a fixed attenuation and a switch connecting only one of the first or second attenuation paths between the input and the audio output. The switch is preferably controlled remote from the amplifier and preferably by a foot-controlled switch. The first attenuation path is preferably variable. The audio level controller can include a first variable resistor coupled to the input terminal and having a wiper coupled to the audio output, the first variable resistor being coupled to a source of reference voltage through a second resistor to form the first attenuation path, the switch being coupled between the junction of the first and second resistors and the source of reference voltage to provide the second attenuation path. Alternatively, the audio level controller can include a first variable resistor coupled between the input terminal and a source of reference voltage and having a wiper coupled to a first terminal of the switch, a second resistor coupled between the input terminal and the source of reference voltage and having a wiper coupled to a second terminal of the switch, the switch coupling only one of the first and second resistor to the audio output. The amplifier can further include lead mode circuitry in parallel with rhythm circuitry coupled between the input terminal and the audio output.

16 Claims, 2 Drawing Sheets

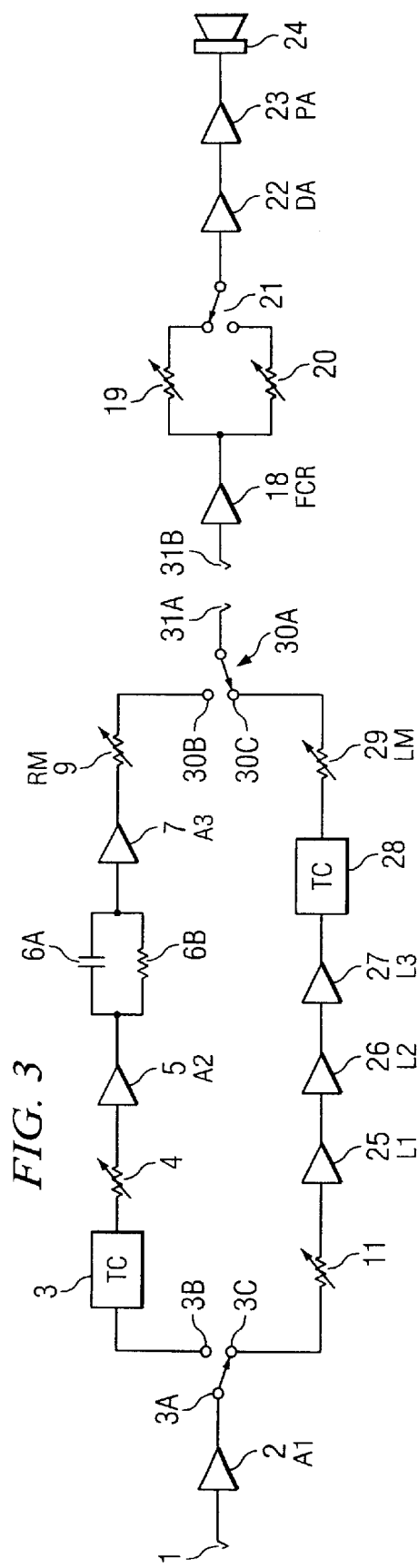
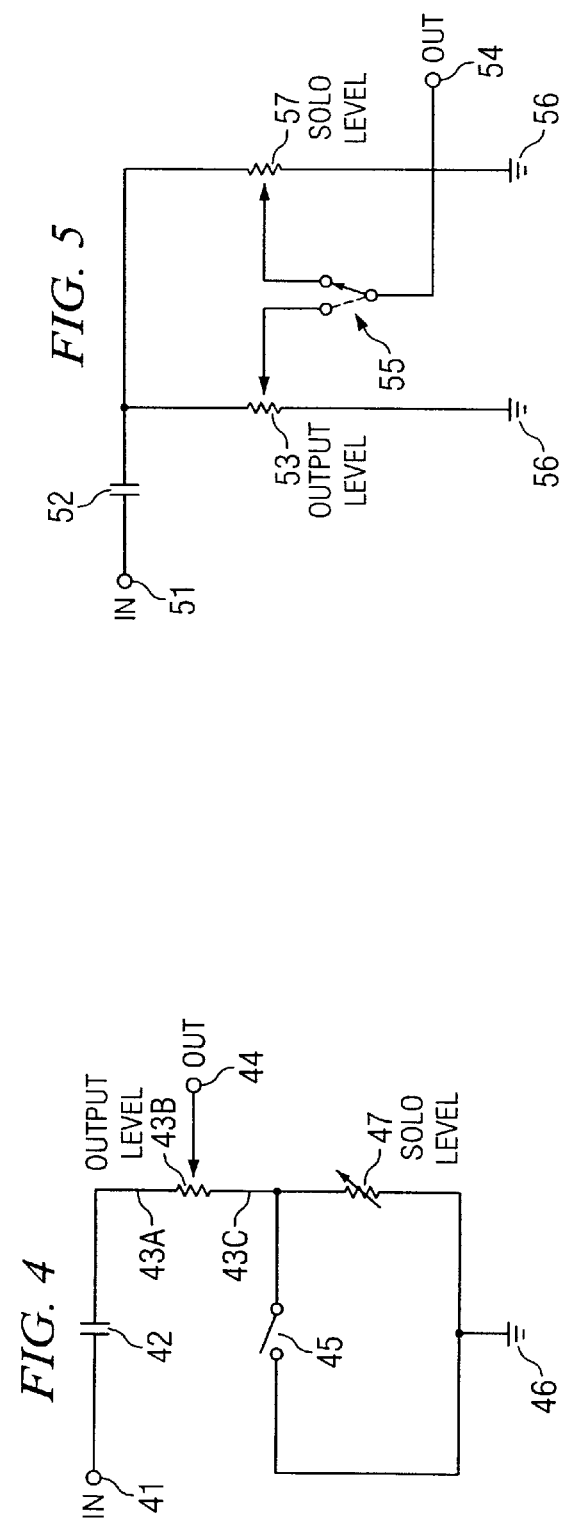
FIG. 3
FIG. 4
FIG. 5

AMPLIFIER WITH ALTERNATE OUTPUT LEVEL

FIELD OF THE INVENTION

This invention relates to an amplifier for use in conjunction with electric guitars.

BACKGROUND AND BRIEF DESCRIPTION OF THE PRIOR ART

Amplifiers for guitars are well known and in use, and they continue to evolve. Originally, and for many years, guitar amplifiers were simple circuits with a single sound and a single volume control. In the late 1970s, the inventor herein began an intense development of the art by introducing the first amplifier with dual mode performance. As set forth in U.S. Pat. No. 4,211,893, this development added a separate high-gain mode of amplification to generate musically desirable harmonics for enhancing single note playing, also known as lead playing. Because of its high gain, the new lead mode was provided with one or more separate attenuators for gain adjustment as well as an attenuator for setting the playing loudness. The dual mode amplifier also included a traditional mode with standard gain for undistorted chordal playing and this mode included its own attenuator for adjusting loudness. Thus, the playing level of either lead or rhythm mode could be set independently.

For many years, the lead enhancement mode was used more or less exclusively for soloing while the traditional rhythm mode was used for foundational playing. Thus, the separate level controls for the individual modes enabled the player to set the lead mode slightly louder for featuring a solo. Over the years, musical styles have changed, blurring the once clear distinction between lead and rhythm playing. Currently, many musical styles may incorporate various amounts of amplifier distortion for either rhythm or lead playing. A guitarist may wish to "step forward" in the band's mix for a spotlight feature in any mode, including modes used primarily for background playing. Thus, the ability to boost the volume level without switching to a different mode provides a unique and valuable capability. This ability is not presently available in prior art amplifiers for use in conjunction with a guitar.

SUMMARY OF THE INVENTION

In accordance with the present invention, the above-described desirable capability is provided and provides an alternate level for overall audio output. The alternate output level may be preset by providing a dedicated attenuator control which is accessed by a footswitch or other remote device, preferably operable by the player desiring the alternate output level. Operating independently from individual channel controls, the alternate output feature enables the guitarist to attain solo volume in any mode at any time during his or her performance.

Briefly, the above is accomplished by introducing into the amplifier circuit a volume or loudness level shifting circuit which is switch operated. The switch is preferably remotely controllable, such as, but not limited to a footswitch operated, preferably by the player desiring the level shift. The level shifting circuit provides, in one state, normal adjustable attenuation and, in a second state, a fixed attenuation level which is preferably preset. In accordance with another embodiment, the signal is passed through a coupling capacitor to remove any d-c signal on the line with the output from the level shifter passing through a variable resistor which is connected to reference voltage (ground) via a variable resistor in one state and directly to reference voltage in the second state, the state being determined by the position of the switch. In accordance with a further embodiment, the signal is passed through a coupling capacitor as in the first embodiment with the signal then being passed to reference voltage through a pair of variable resistors. The wipers on the variable resistors are connected through a switch to the level shifter output, the switch being connected to only one of the wipers. The switch position is remotely controlled as discussed above.

BRIEF DESCRIPTION OF THE DRAWINGS

Referring to the figures, wherein like reference numbers refer to the same or similar functioning elements:

FIG. 3 is a block diagram of a dual channel amplifier showing the present invention in relation to an effects loop;

FIG. 4 is a schematic diagram of another preferred embodiment in accordance with the present invention; and FIG. 5 is a schematic diagram of a further alternate embodiment in accordance with the present invention.

DESCRIPTION OF THE PREFERRED EMBODIMENT

Figure 1:
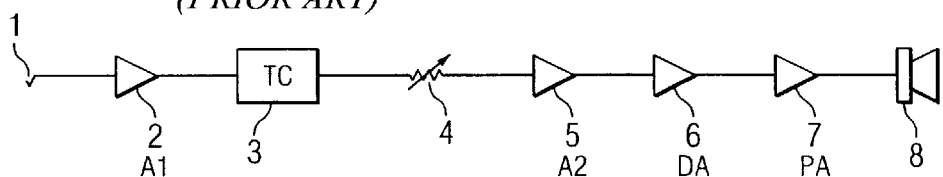
FIG. 1 is a block diagram of a traditional guitar amplifier in accordance with the prior art.

In FIG. 1, which represents the vintage prior art simple circuits with a single sound and a single volume control, there is provided an input terminal 1 which receives electric guitar signals in the form of a small voltage which is then coupled to first amplifier 2. Amplified output is then routed from amplifier 2 through a user adjustable tone control circuit 3. In common practice, the output from the tone control circuit 3 is coupled directly to a volume attenuator 4. A second amplifier stage 5 restores amplitude lost through the tone and volume controls 3, 4 sufficient to feed a typical phase-splitting driver amplifier 6 which supplies push-pull power amplifier 7 and, finally, the loudspeaker 8. This was the configuration of a typical "vintage" amplifier, so called because it predated the advanced dual mode amplifier described with reference to FIG. 2.

Figure 2:
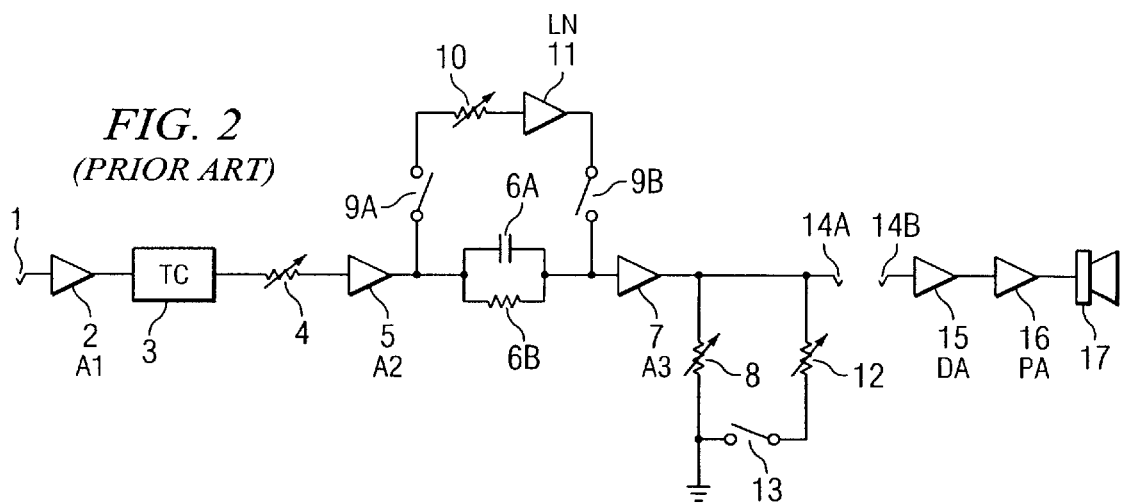
FIG. 2. is a block diagram of a dual mode amplifier in accordance with the prior art.

In the prior art dual mode amplifier, as shown in FIG. 2, an input terminal 1 receives electric guitar signals in the form of a small voltage, which signals are then coupled to a first amplifier 2. Amplified output from amplifer 2 is then routed through a user adjustable tone control circuit 3. Output from the tone control circuit 3 is coupled through a gain attenuator 4, then reamplified through the second voltage gain or amplifier stage 5. At this point, the circuit deviates from that of the traditional vintage prior art of FIG. 1. A fixed attenuator pad comprising capacitor 6A and resistor 6B connected in parallel offers tone shaping to enhance the sound of the clean signal path and substantially reduces signal amplitude which is then restored in a third voltage amplifier 7. An adjustable attenuator 8 determines the loudness level for the rhythm mode. For the high-gain lead mode, a pair of switches 9A, 9B couple the signal around and in paralle with the pad 6A, 6b and through the lead enhancement circuitry comprising variable gain control 10 and voltage amplifier 11. The signal amplitude then applied by the third amplifier stage 7 is then sufficient to drive the stage 7 into massive saturation (non-linear operation). A separate loudness attenuator 12 in parallel with attenuator 8 is activated by closure of switch 13 so that the playing loudness for the lead mode can be independently set. A pair of terminal jacks 14A, 14B are provided for coupling outboard accessory devices into the signal path. A driver amplifier 15, power amplifier 16 and loudspeaker 17 complete the dual mode amplifier.

FIG. 3 illustrates a dual channel amplifier, so called because it provides separate signal channels for rhythm and lead performance. This amplifier can also be described as a parallel configuration whereas the dual mode amplifier adds the lead mode circuitry in series with the rhythm channel. In FIG. 3, input terminal 1 receives signal voltage from an electric guitar and feeds this signal to a first amplifier stage 2 whose output is coupled to a switch device 3A which alternately couples to a rhythm channel at terminal 3B or to a lead channel at terminal 3C. The rhythm channel connection at terminal 3B follows a similar signal path to that described in connection with FIG. 2. A tone control circuit 3 is followed by a volume attenuator 4. A second voltage amplifier 5 feeds a fixed pad comprising capacitor 6A and resistor 6B connected in parallel. A third voltage amplifier 7 has its output coupled through a master volume control 9 to terminal 30B of switch 30A. The lead mode of the amplifier shown in FIG. 3 has its own separate and dedicated channel which is activated when switch terminal 3C of switch 3A receives a signal (as shown). A variable gain control 11 sets the amount of overdrive saturation which accumulates through the succession of voltage amplifiers 25, 26, 27 whose output is fed to a tone control circuit 28. A master volume control 29 determines the output signal amplitude of the lead channel which is coupled alternately with the rhythm channel output through switch 30A, 30B, 30C. A pair of terminal jacks 31A, 31B are provided for coupling outboard accessory devices into the signal path. The amplitude of the signal departing the effect send terminal 31A is determined by the settings of the rhythm master volume control 9 and lead master control 29, each for its respective channel. In practical use, these controls will be set to provide similar average output voltages, even though the waveforms from the two channels will vary dramatically. An effects return amplifier 18 is provided in combination with an output level control 19 such that a very wide range of voltages may be accommodated through the external effects loop of terminals 31A, 31B. Outboard accessory devices typically fall into one of two categories for signal handling, line level or instrument level. By reducing the amplitude of the send signal via the channel master controls 9, 29 and simultaneously increasing the effects return signal by turning up the output level control 19, a small-signal instrument level device will work properly in the effects loop. To take advantage of the superior signal-to-noise virtues of professional grade, line level divides in the effects loop 31A, 31*b*, the player need merely increase the settings of channel masters 9, 29 and reduce the setting of output level control 19. A separate output level control 20, which is an important feature of the invention, is provided and may be alternately selected by switch 21 independent of any other setting of the amplifier. This allows the musician to increase the overall playing loudness of the amplifier to an alternate level, preset by the control 20, without upsetting the signal levels selected for the effect loop 31A, 31B. A driver amplifer 22, power amplifier 23 and loudspeaker 24 are provided to complete the improved device.

FIG. 4 is a schematic diagram of a preferred embodiment of the present invention showing a signal arriving at point 41 from a preceding stage, for example, the output of the effects return amplifier 18 of FIG. 3. For clarity, a coupling capacitor 42 is also shown delivering signal voltage to the top 43A of the output level variable attenuator 43ABC having a top 43A, a wiper 43B and a bottom 43C. A signal from the wiper 43B of the output level control is coupled into the subsequent amplifier circuitry from point 44, such as, for example, output level control 19 or 20 of FIG. 3. When switch 45 is in its closed position (as indicated by the dashed line), the bottom point 43C of the output level attenuator becomes connected to ground 46 and normal operation ensues. The output level control 43ABC can then be adjusted from zero output to maximum output or any level therebetween. When switch 45 opens, the solo level variable resistor 47 becomes functionally inserted in series with the output level control 43ABC and enables an alternate louder setting to be selected for solo playing. At its lowest setting, the solo level control 47 will have no effect when it is activated by switch 45. However, the solo level control 47 can be used to increase the overall playing loudness of the amplifier.

FIG. 5 is a schematic diagram of an alternate embodiment of the present invention showing a signal arriving at point 51 from a preceding stage, for example, the output of the effects return amplifier 18 of FIG. 3. For clarity, a coupling capacitor 52 is also shown delivering signal voltage to the top of both output level control 53 and the solo level control 57. Both controls 53 and 57 are conventionally configured attenuators. A single-pole double-throw switch 55 selects which of the attenuators 53 or 57 is coupled to the output 54 of the circuit. This configuration allows the solo level control 57 to be set independently of the output level control 53 and to be set at a lower signal level than the signal level of output level 53. It does, however, require more complex switching and introduces the added problem of a momentary volume surge while the contact of switch 55 is between the output level position and the solo level position.

In all of the embodiments of FIGS. 3 to 5, the setting of the resistor 20, 47 or 57 for solo playing will remain at a fixed resistance value with insertion into the circuit being under control of the switch 21, 45 or 55 respectively.

Though the invention has been described with reference to specific preferred embodiments thereof, many variations and modifications will immediately become apparent to those skilled in the art. It is therefore the intention that the appended claims be interpreted as broadly as possible in view of the prior art to include all such variations and modifications.

What is claimed is:

1. A guitar amplifier which comprises:
 (a) an input terminal;
 (b) an audio output terminal; and
 (c) an audio level controller connected between said input terminal and said audio output including:
  a first attenuation path;
  a second attenuation path having a fixed attenuation; and
  a switch connecting only one of said first or second attenuation paths between said input and said audio output;
 wherein said audio level controller comprises a first variable resistor coupled to said input terminal and having a wiper coupled to said audio output, said first variable resistor being coupled to a source of reference voltage through a second resistor to form said first attenuation path, said switch coupled between the junction of said first and second resistors and said source of reference voltage to provide said second attenuation path.

2. The amplifier of claim 1 wherein said switch is controlled remote from said amplifier.

3. The amplifier of claim 2 wherein said switch is a foot controlled switch.

4. The amplifier of claim 3 wherein said first attenuation path is variable.

5. The amplifier of claim 2 wherein said first attenuation path is variable.

6. The amplifier of claim 1 wherein said first attenuation path is variable.

7. The amplifier of claim 1 further including lead mode circuitry in parallel with rhythm circuitry coupled between said input terminal and said audio output.

8. A guitar amplifier which comprises:
   (a) an input terminal;
   (b) an audio output terminal; and
   (c) an audio level controller connected between said input terminal and said audio output including:
      a first attenuation path;
      a second attenuation path having a fixed attenuation; and
      a switch connecting only one of said first or second attenuation paths between said input and said audio output;
   wherein said audio level controller comprises a first variable resistor coupled between said input terminal and a source of reference voltage and having a wiper coupled to a first terminal of said switch, a second resistor coupled between said input terminal and said source of reference voltage and having a wiper coupled to a second terminal of said switch, said switch coupling only one of said first and second resistor to said audio output.

9. The amplifier of claim 8 further including lead mode circuitry in parallel with rhythm circuitry coupled between said input terminal and said audio output.

10. The amplifier of claim 8 wherein said switch is controlled remote from said amplifier.

11. The amplifier of claim 10 wherein said switch is a foot controlled switch.

12. The amplifier of claim 11 wherein said first attenuation path is variable.

13. The amplifier of claim 10 wherein said first attenuation path is variable.

14. The amplifier of claim 13 wherein said first attenuation path is variable.

15. A guitar amplifier which comprises:
   (a) an input terminal;
   (b) an output terminal;
   (c) a first signal path selectively coupled between said input terminal and said output terminal;
   (d) a second signal path selectively coupled between said input terminal and said output terminal; and
   (e) a first switch selectively connecting said input terminal to one of said first and second signal paths and a second switch coupling the selected signal path to said output;
   (f) a sound producing element; and
   (g) a dual path variable attenuator circuit for coupling said sound producing element to said output, each of said dual paths having selectively controllable attenuation and each of said dual paths being selectively coupled to said sound producing element;
   wherein said dual path variable attenuator is remotely selectively controllable.

16. An amplifier for electric guitar which comprises:
   (a) an input terminal;
   (b) an output terminal;
   (c) at least two different amplification channels, one of said channels providing substantially clean, undistorted amplified response and another of said at least two different channels providing a distortion enhanced amplified response, said at least two channels being independently preset with reference to output loudness and being alternately selected by selection means remote from said amplifier;
   (d) an alternate output level control in addition to and independent of the controls dedicated to the individual said at least two channels providing an adjustable increase in output loudness without substantially altering the musical performance characteristics of the said at least two channels, said alternate output level control providing a preset increase in overall playing loudness and activated by said selection means remote from said selection means; and
   (e) said selection means remote from said amplifier.

* * * * *